(12) United States Patent
Chen et al.

(10) Patent No.: US 10,087,547 B2
(45) Date of Patent: Oct. 2, 2018

(54) GROWTH OF SINGLE CRYSTAL III-V SEMICONDUCTORS ON AMORPHOUS SUBSTRATES

(71) Applicants: Kevin Chen, Berkeley, CA (US); Rehan Kapadia, Los Angeles, CA (US); Ali Javey, Lafayette, CA (US)

(72) Inventors: Kevin Chen, Berkeley, CA (US); Rehan Kapadia, Los Angeles, CA (US); Ali Javey, Lafayette, CA (US)

(73) Assignee: The Regents of the University of California, Oakland, CA (US)

( * ) Notice: Subject to any disclaimer, the term of this patent is extended or adjusted under 35 U.S.C. 154(b) by 138 days.

(21) Appl. No.: 15/354,063

(22) Filed: Nov. 17, 2016

(65) Prior Publication Data
US 2017/0175290 A1 Jun. 22, 2017

Related U.S. Application Data

(60) Provisional application No. 62/270,132, filed on Dec. 21, 2015.

(51) Int. Cl.
*C30B 25/04* (2006.01)
*C30B 1/10* (2006.01)
(Continued)

(52) U.S. Cl.
CPC .................. *C30B 1/10* (2013.01); *C30B 1/02* (2013.01); *C30B 25/02* (2013.01); *C30B 25/04* (2013.01); *C30B 29/40* (2013.01); *C30B 29/403* (2013.01); *H01L 21/02422* (2013.01); *H01L 21/02428* (2013.01); *H01L 21/02488* (2013.01); *H01L 21/02543* (2013.01)

(58) Field of Classification Search
CPC ........ C30B 25/02; C30B 25/04; C30B 29/403
See application file for complete search history.

(56) References Cited

U.S. PATENT DOCUMENTS

| 6,468,347 B1 * | 10/2002 | Motoki | C30B 25/02 |
| | | | 117/106 |
| 9,650,723 B1 * | 5/2017 | D'Evelyn | C30B 7/105 |

(Continued)

OTHER PUBLICATIONS

Ko, H. et al. Ultrathin compound semiconductor on insulator layers for highperformance nanoscale transistors. Nature 468, 286-289 (2010).

(Continued)

*Primary Examiner* — Matthew J Song

(57) ABSTRACT

This disclosure provides systems, methods, and apparatus related to the growth of single crystal III-V semiconductors on amorphous substrates. In one aspect, a shape of a semiconductor structure to be formed on an amorphous substrate is defined in a resist disposed on the amorphous substrate. A boron group element is deposited over the amorphous substrate. A ceramic material is deposited on the boron group element. The resist is removed from the amorphous substrate. The ceramic material is deposited to cover the boron group element. The amorphous substrate and materials deposited thereon are heated in the presence of a gas including a nitrogen group element to grow a single crystal semiconductor structure comprising the boron group element and the nitrogen group element.

20 Claims, 10 Drawing Sheets

(51) Int. Cl.
*H01L 21/02* (2006.01)
*C30B 1/02* (2006.01)
*C30B 29/40* (2006.01)
*C30B 25/02* (2006.01)

(56) References Cited

U.S. PATENT DOCUMENTS

| | | | |
|---|---|---|---|
| 2001/0008791 A1* | 7/2001 | Gehrke | H01L 21/0242 438/481 |
| 2002/0048964 A1* | 4/2002 | Yuasa | B82Y 20/00 438/763 |
| 2002/0090816 A1* | 7/2002 | Ashby | H01L 21/0237 438/686 |
| 2002/0144643 A1* | 10/2002 | Nishinaga | C30B 23/02 117/84 |
| 2004/0029365 A1* | 2/2004 | Linthicum | C30B 25/02 438/481 |
| 2008/0012025 A1* | 1/2008 | Matsuoka | C30B 25/02 257/77 |
| 2009/0174038 A1* | 7/2009 | Wang | C30B 25/00 257/618 |
| 2009/0239356 A1* | 9/2009 | Yao | H01L 21/02488 438/478 |
| 2011/0018104 A1* | 1/2011 | Nagashima | C30B 25/183 257/615 |
| 2012/0119218 A1* | 5/2012 | Su | C30B 25/18 257/76 |
| 2014/0147650 A1* | 5/2014 | Jiang | H01L 21/0237 428/220 |
| 2014/0290737 A1* | 10/2014 | Javey | H01L 31/0368 136/256 |
| 2016/0017515 A1* | 1/2016 | Han | C30B 25/16 117/95 |
| 2016/0024687 A1* | 1/2016 | McComber | C23C 16/04 428/189 |
| 2016/0149005 A1* | 5/2016 | Oda | C30B 25/183 252/519.1 |
| 2017/0175290 A1* | 6/2017 | Chen | C30B 1/10 |

OTHER PUBLICATIONS

Yoon, J. et al. GaAs photovoltaics and optoelectronics using releasable multilayer epitaxial assemblies. Nature 465, 329-333 (2010).
Duan, X. et al. Indium phosphide nanowires as building blocks for nanoscale electronic and optoelectronic devices. Nature 409, 66-69 (2001).
Morales, A. M. & Lieber, C. M. A laser ablation method for the synthesis of crystalline semiconductor nanowires. Science 279, 208-211 (1998).
Wagner, R. S. & Ellis, W. C. Vapor-liquid-solid mechanism of single crystal growth. Appl. Phys. Lett. 4, 89-90 (1964).
Chung, S.-W. et al. Silicon nanowire devices. Appl. Phys. Lett. 76, 2068-2070 (2000).
Bjork, M. T. et al. One-dimensional heterostructures in semiconductor nanowhiskers. Appl. Phys. Lett. 80, 1058-1060 (2002).
Pan, Z. W. et al. Nanobelts of semiconducting oxides. Science 291, 1947-1949 (2001).
Wang, Z. L. Zinc oxide nanostructures: growth, properties and applications. J. Phys. Condens. Matter 16, R829 (2004).
Heurlin, M. et al. Continuous gas-phase synthesis of nanowires with tunable properties. Nature 492, 90-94 (2012).
Choi, J. H. et al. Nearly single-crystalline GaN light-emitting diodes on amorphous glass substrates. Nat. Photon. 5, 763-769 (2011).
Shon, J. W. et al. Fabrication of full-color InGaN-based light-emitting diodes on amorphous substrates by pulsed sputtering. Sci. Rep. 4, 5325 (2014).
Kapadia, R. et al. A direct thin-film path towards low-cost large-area III-V photovoltaics. Sci. Rep. 3, 2275 (2013).
Kapadia, R. et al. Deterministic nucleation of InP on metal foils with the thin-film vapor-liquid-solid growth mode. Chem. Mater. 26, 1340-1344 (2014).
Chen, K. et al. Direct growth of single-crystalline III-V semiconductors on amorphous substrates. Nature Communications 7, 10502 (2016).

* cited by examiner

GROWTH OF SINGLE CRYSTAL III-V SEMICONDUCTORS ON AMORPHOUS SUBSTRATES

RELATED APPLICATIONS

This application claims priority to U.S. Provisional Patent Application Ser. No. 62/270,132, filed Dec. 21, 2015, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to semiconductor processing and more particularly to the growth of single crystal III-V semiconductors on amorphous substrates.

BACKGROUND

Owing to their high-electron mobilities and direct band gaps, III-V compound semiconductors are ideal for many electronic and optoelectronic applications such as high-performance transistors, photovoltaics, LEDs, and photodetectors. The development of epitaxial growth techniques such as molecular beam epitaxy, metal-organic chemical vapor deposition (MOCVD), and pulsed laser deposition have enabled the growth of single-crystalline III-V thin films with excellent performance for device applications. In order to obtain such high-quality single-crystalline thin films, the growth needs to be performed on a closely lattice-matched substrate.

SUMMARY

One innovative aspect of the subject matter described in this disclosure can be implemented in a method including defining a shape of a semiconductor structure to be formed on an amorphous substrate in a resist disposed on the amorphous substrate. A boron group element is deposited over the amorphous substrate. A ceramic material is deposited on the boron group element. The resist is removed from the amorphous substrate. The ceramic material is deposited to cover the boron group element. The amorphous substrate and materials deposited thereon are heated in the presence of a gas including a nitrogen group element to grow a single crystal semiconductor structure comprising the boron group element and the nitrogen group element.

In some implementations, the ceramic material is removed after the heating operation. In some implementations, after the shape of a semiconductor structure to be formed is defined, a nucleation layer is deposited on the amorphous substrate. The boron group element is then deposited on the nucleation layer.

Another innovative aspect of the subject matter described in this disclosure can be implemented in a method including defining a shape of a semiconductor structure to be formed in a resist deposited on a layer of $SiO_2$. A layer of $MoO_x$ is deposited on the layer of $SiO_2$. Indium (In) is deposited on the layer of $MoO_x$. $SiO_x$ is deposited on the In. The resist is removed from the layer of $SiO_2$. $SiO_x$ is deposited to cover the In. The layer of $SiO_2$ and materials deposited thereon are heated in the presence of $PH_3$ to grow a single crystal semiconductor structure comprising InP.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1:
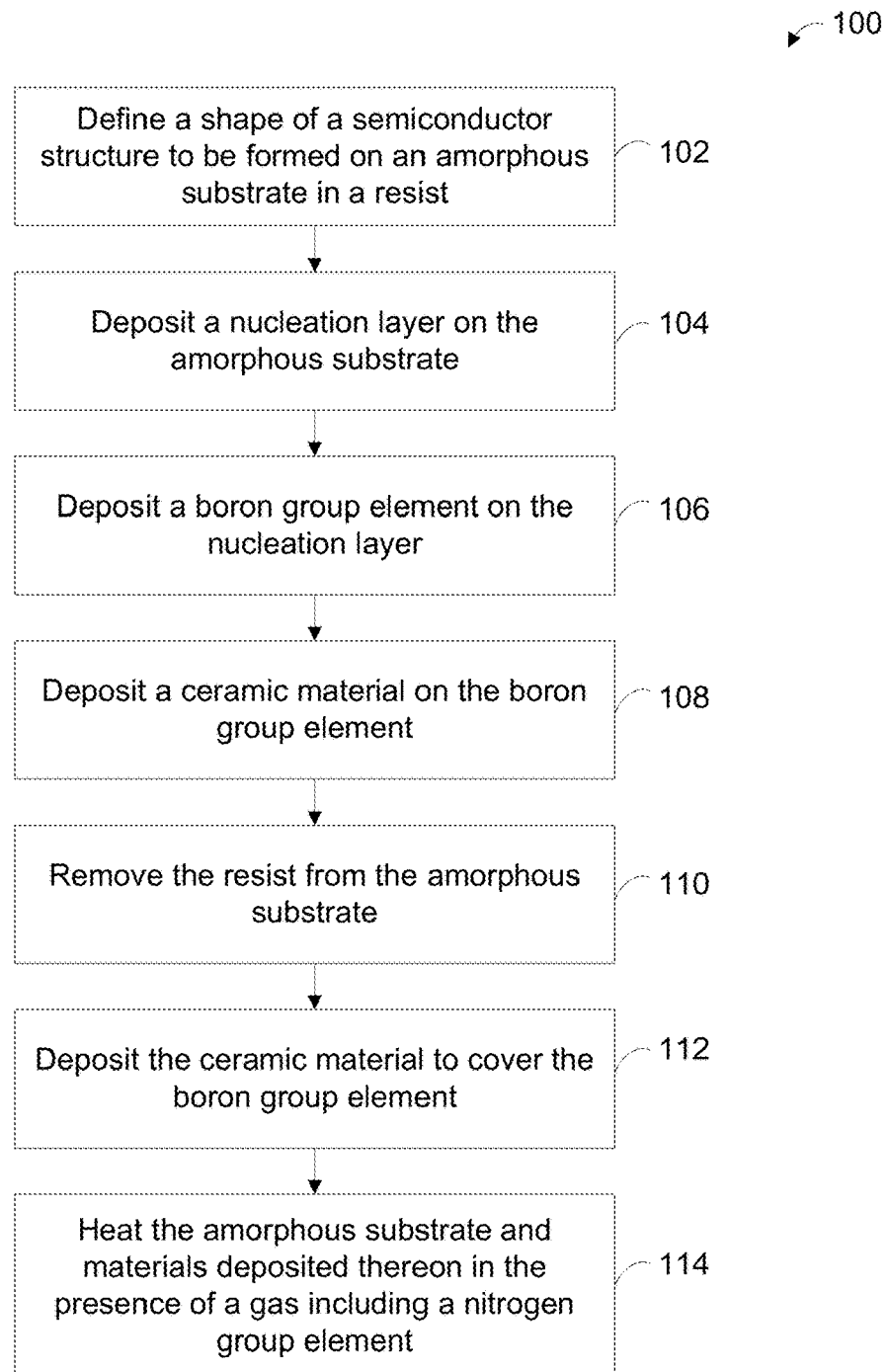
FIG. 1 shows an example of a flow diagram illustrating a process for growing a single crystal III-V semiconductor on an amorphous substrate.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 90% of the targeted value, within 95% of the targeted value, or within 99% of the targeted value.

The growth of single crystals on amorphous substrates would enable new applications, such as providing a simplified pathway for heterogeneous integration of III-V devices onto application-specific substrates. However, deterministic synthesis of single-crystal semiconductors on amorphous substrates presents a fundamental challenge in the field of materials science—one that arises from the thermodynamics and kinetics of nucleation and crystal growth. Specifically, the slow kinetics governing coalescence of two grains into a single grain dictates that any single-crystal structure on an amorphous substrate needs to be grown from a single nucleus. Thus, for single-crystal growth, the first nucleus that forms must grow to fill the desired volume before another nucleus is formed. Within most growth approaches, the relative nucleation and growth rates are difficult to control, and the maximum grain size attainable is often on the order of the material thickness, resulting in nanocrystalline structures for nanoscale thickness materials.

Because of the technology-driven need for single-crystal semiconductors on amorphous substrates, a number of synthesis techniques have been explored in recent years. These approaches include: (i) epitaxial growth of thin films on single-crystalline substrates followed by selective layer transfer to a desired substrate; and (ii) vapor-liquid-solid, vapor-solid, and aerosol-based nanowire growth. For GaN, in particular, the use of 'pre-orienting' layers to conduct local hetero-epitaxy has also been demonstrated. While such approaches have resulted in broadening the scope and functionality of various electronic materials with unique properties, direct growth of single-crystal semiconductors with 'user-defined' geometries and dimensions on amorphous substrates has yet to be demonstrated. Such an approach would offer advantages in terms of compatibility with traditional device processing technology, scalability, and processing cost. In addition, it would provide a direct pathway to three-dimensional integration of electronic materials and devices with appreciable levels of complexity.

As described herein, a templated liquid-phase (TLP) crystal growth process can be used as a synthetic approach for growth of high-performance, nano- and micro-scale single-crystal compound semiconductors with user-defined geometries on arbitrary substrates. FIG. 1 shows an example of a flow diagram illustrating a process for growing a single crystal III-V semiconductor on an amorphous substrate. FIGS. 2A-2E show examples of schematic illustrations of a single crystal III-V semiconductor on an amorphous substrate at various stages in the process. A single crystal semiconductor material consists of a single (i.e., one) crystal and includes no grain boundaries.

Starting at block 102 of the method 100 shown in FIG. 1, a shape of a semiconductor structure to be formed on an amorphous substrate is defined in a resist disposed on the amorphous substrate. For example, if a square semiconductor structure is to be formed on the amorphous substrate, a square shape is defined in the resist. If a circular semiconductor structure is to be formed on the amorphous substrate, a circular shape is defined in the resist.

In some embodiments, the amorphous substrate comprises a material selected from a group consisting of silicon dioxide, aluminum oxide, or an oxide glass (e.g., a borosilicate glass). For example, when the amorphous substrate comprises silicon dioxide, the silicon dioxide ($SiO_2$) may be a layer of silicon dioxide on a silicon (Si) substrate. In some embodiments, the amorphous substrate comprises a metal (e.g., molybdenum) or an amorphous metal. The amorphous substrate may be almost any kind of amorphous substrate.

In some embodiments, the resist comprises a photoresist or an electron resist. For example, the resist may comprise poly(methyl methacrylate) (PMMA), poly(methyl glutarimide) (PMGI), or a mixture of diazonaphthoquinone (DNQ) and novolac resin. In some embodiments, dimensions (e.g., a length or a width) of the shape defined in the resist have a dimension of about 10 nanometers (nm) to 500 microns. For example, if a square shape is defined in the resist, the square may have a length and width of 10 nm to 500 microns. For example, if a circular shape is defined in the resist, the circle may have a diameter of 10 nm to 500 microns.

Figure 2A:
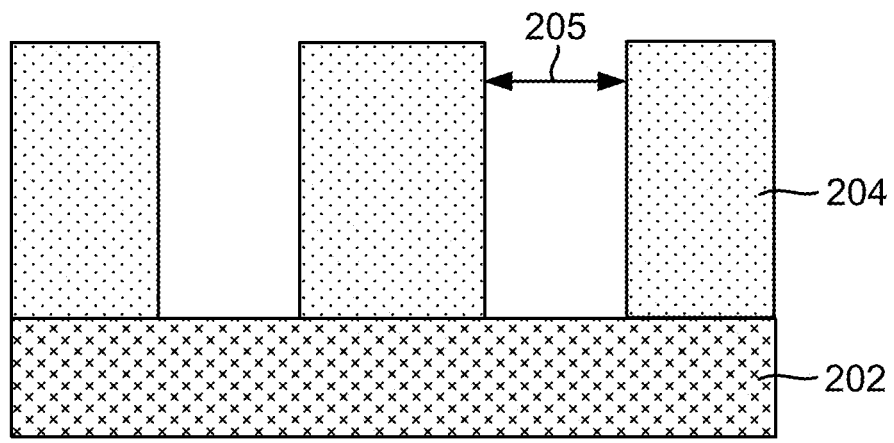
FIGS. 2A-2E show examples of schematic illustrations of a single crystal III-V semiconductor on an amorphous substrate at various stages in the process.

FIG. 2A shows an example of a cross-sectional schematic illustration of the structure at this point (up through block 102) of the method 100. The structure shown in FIG. 2A includes an amorphous substrate 202 and a resist 204 disposed on the amorphous substrate 202. Features are defined in the resist. A feature defined in the resist has a dimension 205 that is about 10 nm to 500 microns. In some embodiments, the dimension 205 is the largest width or length of the feature defined in the resist. As shown in FIG. 2A, in some embodiments, a plurality of features are defined in the resist.

At block 104 of the method 100, a nucleation layer is deposited on the amorphous substrate. For example, at block 104, the nucleation layer is deposited on exposed regions (i.e., regions not having resist disposed thereon) of the amorphous substrate. In some embodiments, the nucleation layer is deposited with a chemical vapor deposition (CVD) process or a physical vapor deposition (PVD) process. For example, the nucleation layer may be evaporated onto the amorphous substrate. In some embodiments, the nucleation layer has a thickness of about 1 nm to 10 nm. In some embodiments, the nucleation layer comprises an oxide material. For example, in some embodiments, the nucleation layer is a material selected from a group consisting of molybdenum oxide, indium oxide, gallium oxide, and tungsten oxide. In some embodiments, the nucleation layer consists of molybdenum. In some embodiments, the surface energy between the nucleation layer and a liquid state of a boron group element deposited thereon (e.g., at block 106) is low so that the liquid state of a boron group element wets the nucleation layer.

In some embodiments of the method 100, block 104 is not performed and a nucleation layer is not deposited on the amorphous substrate. A nucleation layer is deposited when the surface energy of the boron group element deposited at block 106 and the substrate is high. When the surface energy of the boron group element and the substrate is low (e.g., when the substrate comprises molybdenum), then a nucleation layer may not be deposited on the amorphous substrate.

Figure 2B:
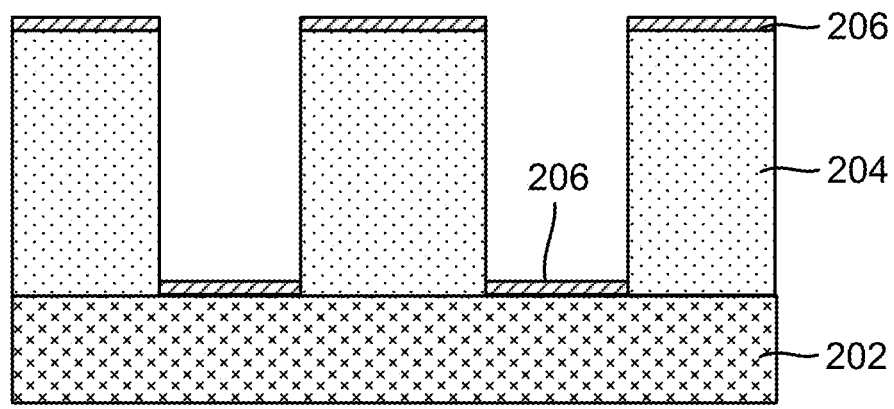

FIG. 2B shows an example of a cross-sectional schematic illustration of the structure at this point (up through block 104) of the method 100. The structure shown in FIG. 2B includes the amorphous substrate 202, the resist 204 disposed on the amorphous substrate 202, and a nucleation layer 206 disposed on exposed regions (i.e., regions not having resist disposed thereon) of the amorphous substrate 202. As shown in FIG. 2B, in some embodiments, the nucleation layer 206 is deposited on the resist 204 at block 104.

At block 106 of the method 100, a boron group element is deposited on the nucleation layer. In some embodiments, the boron group element is deposited with a CVD process or a PVD process. For example, the boron group element may be evaporated onto the nucleation layer. Boron group elements, which also may be referred to as group III elements, include boron, aluminum, gallium, and indium. In some embodiment, the boron group element has a thickness of about 10 nm to 5 microns, or about 1 micron to 5 microns. In some embodiments, when a nucleation is not deposited at block 104, a boron group element is deposited on the amorphous substrate.

At block 108 of the method 100, a ceramic material is deposited on the boron group element. In some embodiments, the ceramic material is deposited with a CVD process or a PVD process. For example, the ceramic material may be evaporated onto the boron group element. In some embodiments, the ceramic material is amorphous. In some embodiments, the ceramic material comprises a material selected from a group consisting of silicon oxide ($SiO_x$), silicon nitride ($SiN_x$), and aluminum oxide ($AlO_x$).

Figure 2C:
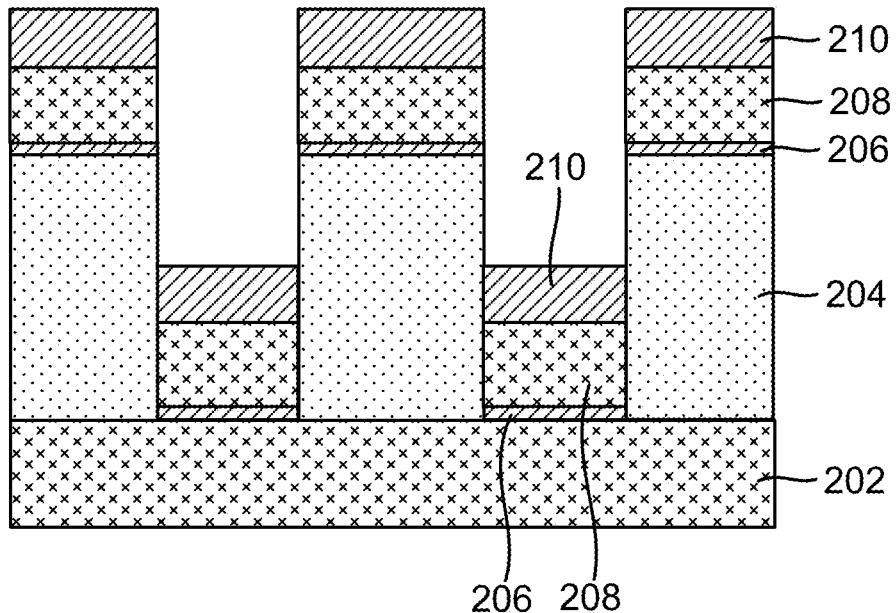

FIG. 2C shows an example of a cross-sectional schematic illustration of the structure at this point (up through block 108) of the method 100. The structure shown in FIG. 2C includes the amorphous substrate 202, the resist 204 disposed on the amorphous substrate 202, the nucleation layer 206 disposed on exposed regions of the amorphous substrate 202, a boron group element 208 disposed on the nucleation layer 206, and a ceramic material 210 disposed on the boron group element 208. As shown in FIG. 2C, in some embodiments, the boron group element 208 and the ceramic material 210 are deposited on the nucleation layer 206 disposed on the resist 204 at blocks 106 and 108.

At block 110 of the method 100, the resist is removed from the amorphous substrate. In some embodiments, when materials are deposited on the resist (e.g., the nucleation layer, the boron group element, and the ceramic material), these materials are also removed at block 110. In some embodiments, the resist is removed with a solvent (e.g., acetone) that dissolves the resist. In the field of microfabrication, the operations at blocks 102-110 may be referred to as a lift-off process.

Figure 2D:
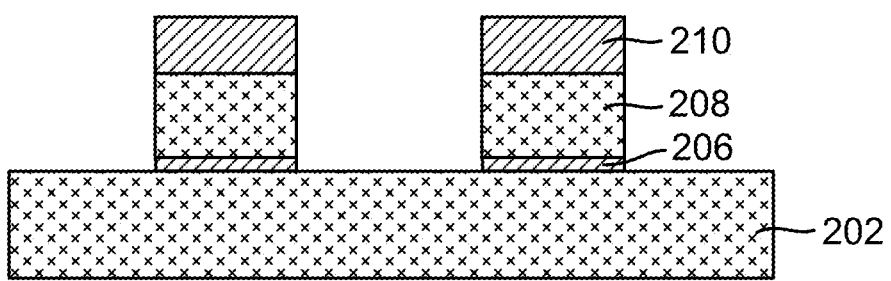

FIG. 2D shows an example of a cross-sectional schematic illustration of the structure at this point (up through block 110) of the method 100. The structure shown in FIG. 2D includes the amorphous substrate 202, the nucleation layer 206 disposed on the amorphous substrate 202, the boron group element 208 disposed on the nucleation layer 206, and the ceramic material 210 disposed on the boron group element 208. The resist and the materials deposited thereon as shown in FIG. 2C have been removed from the amorphous substrate 202.

At block 112 of the method 100, the ceramic material is deposited to cover the boron group element. For example, as shown in FIG. 2D, after the resist is removed at block 110, sides of the boron group element are exposed. In some embodiments, at block 112, the ceramic material is deposited to completely cover or encapsulate the boron group element. In some embodiments, after block 112 the boron group element is in contact only with the ceramic material and the nucleation layer; i.e., there are no portions of the boron group element that are not in contact with the nucleation layer or the ceramic material. In some embodiments, when the nucleation layer is not deposited at block 104, after block 112 the boron group element is in contact only with the ceramic material and the amorphous substrate; i.e., there are no portions of the boron group element that are not in contact with the amorphous substrate or the ceramic material. In some embodiments, the ceramic material deposited at block 112 is the same ceramic material as the ceramic material deposited at block 108. In some embodiments, the ceramic material is deposited with a CVD process or a PVD process. For example, when the ceramic material is deposited with an evaporation process, the evaporation process may be performed multiple times (e.g., about three) to cover the boron group element. Evaporation is a PVD process that deposits a material in the line of sight of the evaporation source. To completely cover the boron group element, the evaporation source may need to be positioned at multiple angles with respect to the surface of the amorphous substrate during the deposition process. In some embodiments, the ceramic material has a thickness of about 10 nm to 200 nm or about 10 nm to 100 nm after block 112.

Figure 2E:
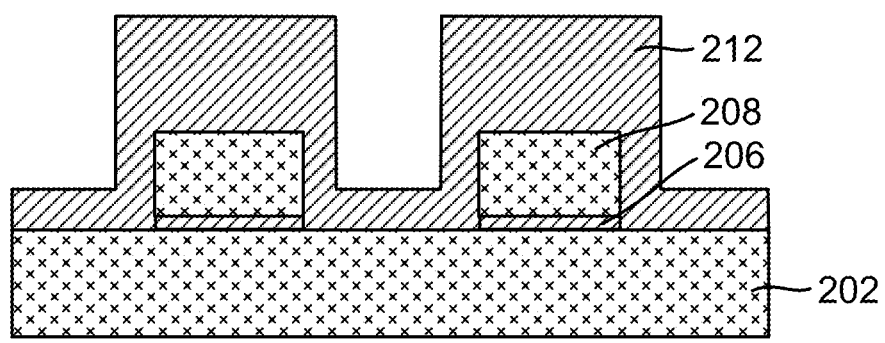

FIG. 2E shows an example of a cross-sectional schematic illustration of the structure at this point (up through block 112) of the method 100. The structure shown in FIG. 2E includes the amorphous substrate 202, the nucleation layer 206 disposed on the amorphous substrate 202, the boron group element 208 disposed on the nucleation layer 206, and the ceramic material 210 disposed on the boron group element 208 to completely cover or encapsulate the boron group element 208.

At block 114 of the method 100, the amorphous substrate and materials deposited thereon (i.e., the nucleation layer, the boron group element, and the ceramic material) are heated in the presence of a gas including a nitrogen group element. Nitrogen group elements, also referred to group V elements, include nitrogen, phosphorus, arsenic, and antimony. In some embodiments, the gas including the nitrogen group element comprises a metal-organic compound or a metal hydride (e.g., $PH_3$ or $AsH_3$). The operation at block 114 results in the growth of a single crystal semiconductor structure comprising the boron group element and the nitrogen group element (i.e., a III-V semiconductor).

The ceramic material deposited at blocks 108 and 112 should be stable (e.g., not decompose) at the temperature to which the amorphous substrate and the materials disposed thereon are heated at block 114. The ceramic material should not react or mix with (or should react or mix minimally with) a liquid state of the boron group element when the amorphous substrate and the materials disposed thereon are heated at block 114. The ceramic material should not react with (or should react minimally with) the nitrogen group element when the amorphous substrate and the materials disposed thereon are heated at block 114. The ceramic material should also comprise a structure that allows for diffusion of the nitrogen group element thorough the ceramic material at block 114. For example, in some embodiments, the ceramic material should be porous or have some porosity to allow for diffusion of the nitrogen group element. For example, when the ceramic material comprises $SiO_x$, $SiO_x$ can have a low density and a structure that allows for diffusion of nitrogen group element thorough the $SiO_x$.

In some embodiments, instead of heating the amorphous substrate and materials deposited thereon in the presence of a gas including a nitrogen group element, the amorphous substrate and materials deposited thereon are heated in the presence of a nitrogen group element. In some embodiments, a carrier gas (e.g., hydrogen) is used to aid in the transport of the vapor of the nitrogen group element to the amorphous substrate and materials deposited thereon so that the nitrogen group element can diffuse through the ceramic material. For example, when single crystal semiconductor structure to be grown comprises InP, phosphorus (e.g., red phosphorus) may be used with hydrogen as a carrier gas.

In some embodiments, the amorphous substrate and materials deposited thereon are heated to about 300° C. to 1500°

C. or about 300° C. to 850° C. The temperature to which the amorphous substrate and materials deposited are heated is specified such that the boron group element melts to a liquid phase. For example, when the boron group element comprises aluminum, the amorphous substrate and materials deposited thereon may be heated to about 660° C. (i.e., the melting point of aluminum) to 1500° C. or about 660° C. to 850° C. In some embodiments, the heating is performed in a chemical vapor deposition furnace (e.g., that allows for the flow of the gas including the nitrogen group element) or a metal-organic chemical vapor deposition (MOCVD) apparatus.

While at the elevated temperature at block 114, the nitrogen group element diffuses through the ceramic material. The nitrogen group element supersaturates the liquid boron group element and a solid (e.g., a nuclei) comprising the boron group element and the nitrogen group element will form. A depletion zone of the nitrogen group element will form around this solid and prevent further nucleation. This allows a single crystal semiconductor structure to grow. In some embodiments, growth of the single crystal semiconductor structure occurs at the elevated temperature at block 114 in about 5 minutes to 2 hours, or about 5 minutes to 20 minutes. The growth time will be reduced when the thickness of the oxide layer is smaller, when the temperature at block 114 is higher, and when the pressure or partial pressure of the nitrogen group element is higher. In some embodiments, the single crystal semiconductor structure comprises a semiconductor selected from a group consisting of boron nitride, boron phosphide, boron arsenide, aluminum nitride, aluminum phosphide, aluminum arsenide, aluminum antimonide, gallium nitride, gallium phosphide, gallium arsenide, gallium antimonide, indium nitride, indium phosphide, indium arsenide, and indium antimonide.

In some embodiments, a length or a width of the single crystal semiconductor structure is 1 to 3 orders of magnitude larger than a thickness of the single crystal semiconductor structure. The length or the width of the single crystal semiconductor structure being larger than the thickness of the single crystal semiconductor structure aids in ensuring that a single crystal semiconductor structure will form at block 114. If multiple nuclei form and grow at block 114, a single crystal semiconductor structure will not be formed. Instead, a polycrystalline or a nanocrystalline semiconductor structure will be formed.

In some embodiments, the method 100 further comprises removing the ceramic material. For example, after block 112, ceramic material remains disposed on the amorphous substrate and the single crystal semiconductor structure. The ceramic material may be removed from the amorphous substrate and the single crystal semiconductor structure. The ceramic material may be removed with an etching process (e.g., wet etching or plasma etching), for example. Wet etching includes the removal of the ceramic material using hydrofluoric acid.

In some embodiments, at block 114, the amorphous substrate and materials deposited thereon are heated in the presence of an additional gas including a doping element. In some embodiments, a doped III-V semiconductor structure is fabricated with the method 100. In some embodiments, the doping element comprises an oxygen group element, which may also be referred to as a group IV element. In some embodiments, the gas including the doping element comprises a metal-organic compound. When a single crystal structure comprising InP is grown, the doping element may comprise zinc, sulfur, or magnesium, for example.

In some embodiments, the method 100 can be used to fabricate single crystal semiconductor structure comprising ternary and quaternary III-V semiconductors. For example, ternary III-V semiconductor structures comprising InGaP, InAsP, GaAsP, or InPSb may be fabricated. For example, quaternary III-V semiconductor structures comprising AlGaInP, InGaAsP, AlGaAsP, InGaAsSb, InAsSbP, AlGaAsN, or GaAsSbN may be fabricated. For example, to fabricate a single crystal semiconductor structure comprising InAsP, a gas including As and a gas including P can be used a block 114 of the method 100. As another example, to fabricate a single crystal semiconductor structure comprising InGaP, In could be deposited on the nucleation layer at block 106. At block 114, a gas including P and a gas including Ga (i.e., a gas including a boron group element) can be used.

Embodiments of the method 100 shown in FIG. 1 can be used to fabricate single crystal structures of other binary and ternary compounds in addition to III-V semiconductors. For example, one element of the binary and ternary compound should be a liquid and not have a high vapor pressure at elevated temperatures. This element is deposited on the nucleation layer at block 106. One element of the binary and ternary compound should be a vapor or in a gas phase at elevated temperatures. This element diffuses through the oxide layer to form the binary and ternary compound at block 114. For example, single crystal binary compound structure comprising bismuth sulfide, bismuth selenide, or bismuth telluride can be fabricated. To fabricate these binary compounds, bismuth is depositing at block 106 and a gas including sulfur, selenium, or tellurium is present at block 114.

Figure 2F:
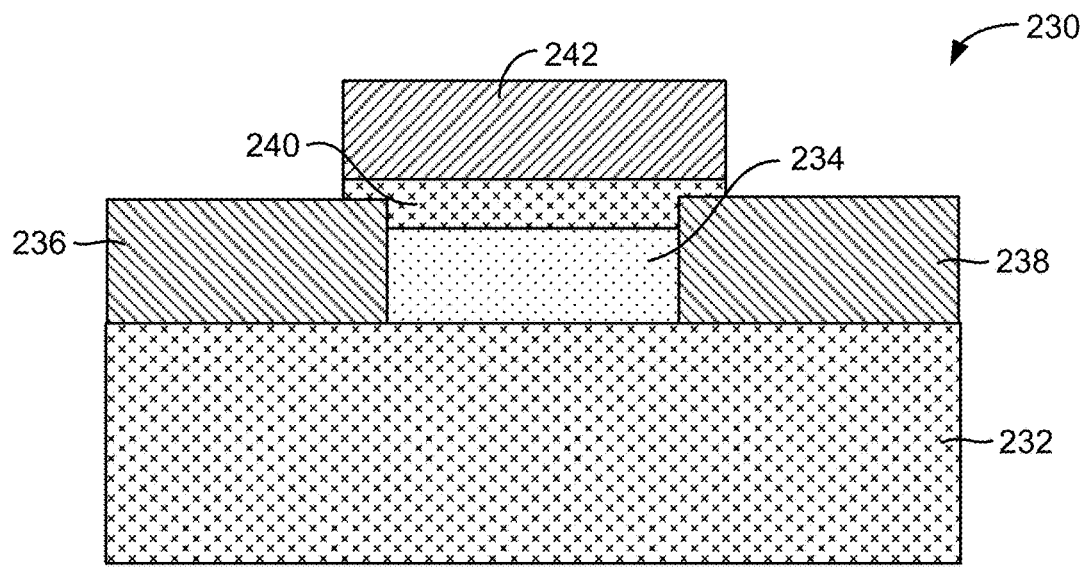
FIGS. 2F and 2G show examples of schematic illustrations of a semiconductor field effect transistor (MOSFET) with a top gate.
Figure 2G:
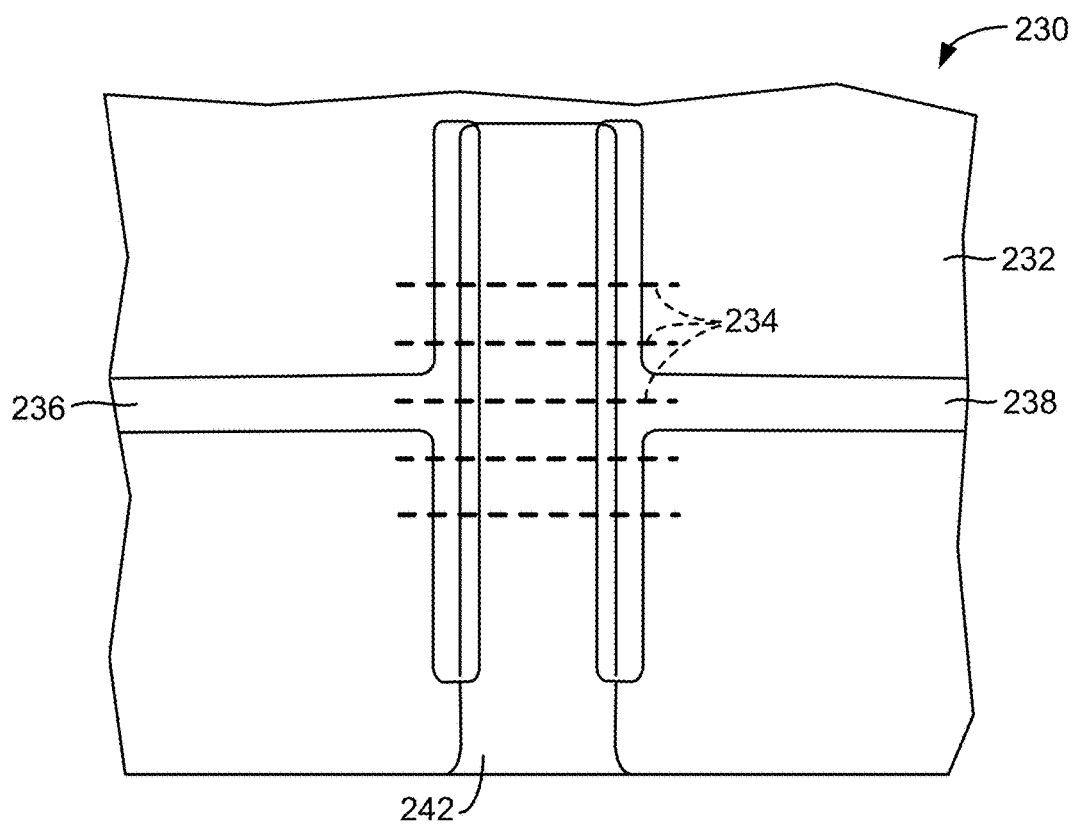

Semiconductor devices including a single crystal III-V semiconductor structure disposed on an amorphous substrate can also be fabricated using embodiments of the method 100 shown in FIG. 1. FIGS. 2F and 2G show examples of schematic illustrations of a semiconductor field effect transistor (MOSFET) with a top gate. FIG. 2F shows an example of a cross-sectional schematic illustration. FIG. 2G shows a top-down schematic illustration.

As shown in FIGS. 2F and 2G, a semiconductor field effect transistor 230 includes an amorphous substrate 232, a single crystal III-V semiconductor structure 234 disposed on the amorphous substrate 232, a source electrode 236 disposed on the amorphous substrate 232 and in contact with the single crystal III-V semiconductor structure 234, and a drain electrode 238 disposed on the amorphous substrate 232 and in contact with the single crystal III-V semiconductor structure 234. As shown in FIG. 2G, in some embodiments, the semiconductor field effect transistor 230 includes multiple strips or nanowires of the single crystal III-V semiconductor structure 234. Also disposed on the single crystal III-V semiconductor structure 234 is an insulating material 240, and a gate electrode 242 is disposed on the insulating material 240.

In some embodiments, the amorphous substrate 232 comprises a layer of silicon dioxide ($SiO_2$) on a silicon (Si) substrate. In some embodiments, the single crystal III-V semiconductor structure 234 comprises InP. In some embodiments, the source electrode 236 and the drain electrode 238 each comprise a germanium/gold/nickel alloy. In some embodiments, the insulating material 240 comprises zirconium oxide. In some embodiments, the gate electrode 242 comprises nickel or indium tin oxide.

Single crystal indium phosphide (InP) was grown using an embodiment of the method 100 shown in FIG. 1. The examples of the method 100 described below are not intended to be limiting. Iridium phosphide was chosen as a model III-V material system owing to its importance in a wide variety of fields, from high-speed electronics to lasers and photovoltaics. Thermally grown $SiO_2$ and glass were selected as examples of amorphous materials on which TLP crystal growth can be performed.

For TLP growth of InP, a clean silicon wafer with a 50 nm thick thermal oxide was lithographically patterned with the desired InP shape. A 1 nm to 10 nm thick $MoO_x$ layer was evaporated onto the thermal oxide, followed by evaporation of In of a specified thickness and a 10 nm to 100 nm thick $SiO_x$ layer. As $SiO_2$ has a high surface energy for nucleation, the $MoO_x$ layer helps to promote nucleation of the InP. To obtain a smooth In layer, the evaporation of the In and $SiO_x$ bilayer was performed with the substrate chuck cooled to <150 K using liquid $N_2$. The whole $MoO_x/In/SiO_x$ stack was then lifted off. After liftoff, angled evaporation was utilized to coat the exposed side regions of the In with $SiO_x$ with thicknesses ranging from 4 nm to 50 nm. After evaporation of $SiO_x$, the In was encapsulated by the $SiO_x$.

Growth of the InP patterns for electron backscatter diffraction (EBSD) crystal analysis and for the fabrication of transistors was performed in a hot-wall chemical vapor deposition (CVD) tube furnace at 500° C. to 535° C. During the growth of the single crystal InP structures, the $SiO_x$ template confined the liquid In so that the resulting InP crystal had the same shape as that of the original In pattern. Phosphorous diffused through the $SiO_x$ cap and supersaturated the liquid In, precipitating out in the form of an InP nucleus. 10% $PH_3$ in $H_2$ was used as the phosphorous source and was further diluted to a specified dilution.

Growth of a sample on a 4-inch $Si/SiO_2$ wafer and the doping-dependent studies were performed with a cold-wall CVD system. 10% $GeH_4$ in $H_2$ was used as the Ge dopant source. The samples were grown for 10 minutes to 20 minutes at pressures of 100 Torr to 300 Torr (partial $PH_3$ pressure of 0.1 Torr to 10 Torr) and growth temperatures between 500° C. and 535° C.

One key feature of the TLP growth mode is that a phosphorous depletion zone forms around each growing nucleus, preventing further nucleation. Previously, it was shown that for continuous In thin films, this depletion zone can be on the order of hundreds of microns, leading to ultra-large grain sizes. Here, through pre-patterning the indium in mechanically confined templates such that the phosphorous depletion zone from the first nucleus occupies the entire template, 'single crystalline' InP growth in user-defined geometries can be achieved.

Figure 3A:
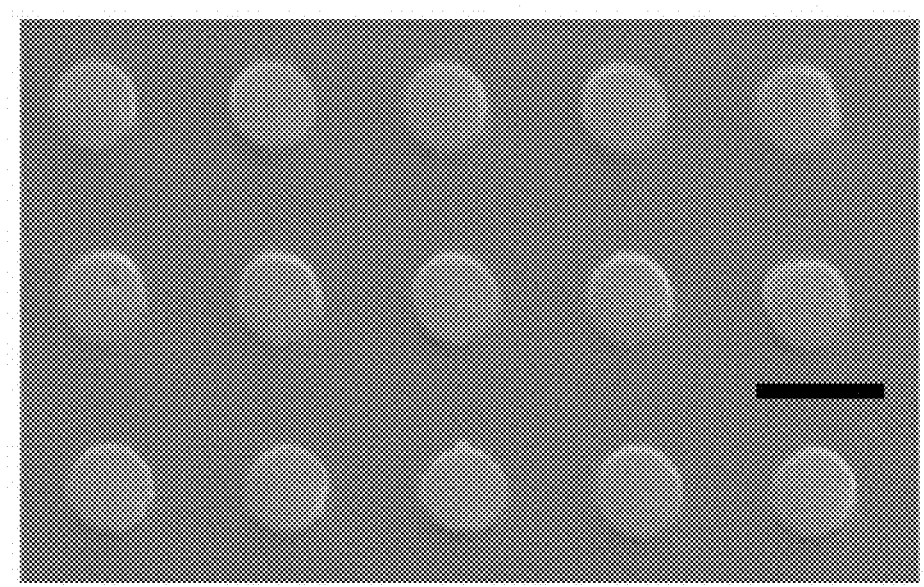
FIG. 3A shows an example of a scanning electron microscope (SEM) image of an InP crystal array shaped into circles grown via TLP crystal growth.

Scanning electron microscope (SEM) images of the InP crystal arrays shaped into circles having a diameter of 7 microns grown via TLP crystal growth are shown in FIG. 3A. The scale bar in FIG. 3A is 10 microns. InP crystal arrays shaped into rings and squares were also grown. The original In template geometry is maintained after growth, allowing for deterministic shape control of InP crystals. The stoichiometry of the films was confirmed by electron dispersive spectroscopy (EDS) to be 1:1 In:P. X-ray diffraction spectroscopy on an array of InP circles displayed only peaks corresponding to zincblende InP, indicating that all of the In was converted to InP. The crystallinity of the InP patterns with lateral dimensions of ~5 microns to 7 microns was confirmed via electron backscatter diffraction (EBSD) mapping. The EBSD mapping showed that, excluding twinning, each individual circle shown in FIG. 3A is a single crystal but with different crystal orientations. In addition, from the orientation distribution obtained from EBSD, it was seen that there is a preferential texturing of the growth in the (1 0 n) direction, where n ranges between 1 and 2.

Figure 3B:
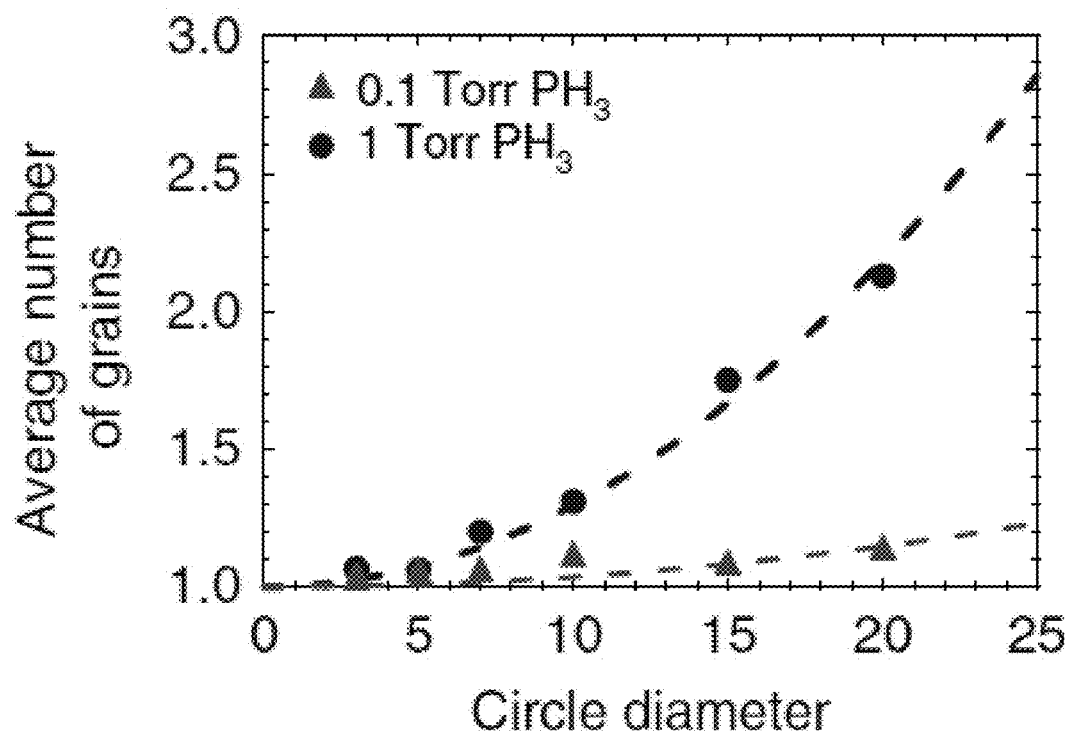
FIG. 3B shows an example of a plot of the number of grains per circle versus the circle diameter.

To study the effect of growth conditions and InP feature size on the number of grains, InP circles with diameters varying from 3 microns to 20 microns were patterned using TLP crystal growth at two different $PH_3$ partial pressures. As shown in FIG. 3B, the number of grains per circle (measured with EBSD) increases according to a quadratic relation with the circle diameter, d, which can be fit by the equation:

$$N_{grains} = 1 + \beta d^2$$

$N_{grains}$ is the average number of grains per circle and $\beta$ is a proportionality factor that takes into account growth parameters such as P flux, the geometry associated with nucleation, and the resulting average nucleation rate. As expected from this model, there is also a strong dependence of the number of grains on the $PH_3$ partial pressure. As the $PH_3$ partial pressure is lowered, the P flux into the liquid decreases, resulting in a reduced nucleation rate and larger P depletion zones. This is reflected in a drop in $\beta$ from $3 \times 10^{-3}$ to $4 \times 10^{-4}$ as the $PH_3$ partial pressure is reduced from 1 Torr to 0.1 Torr, allowing the average number of grains per feature to be maintained at near unity even for diameters as large as 20 microns.

Figure 3C:
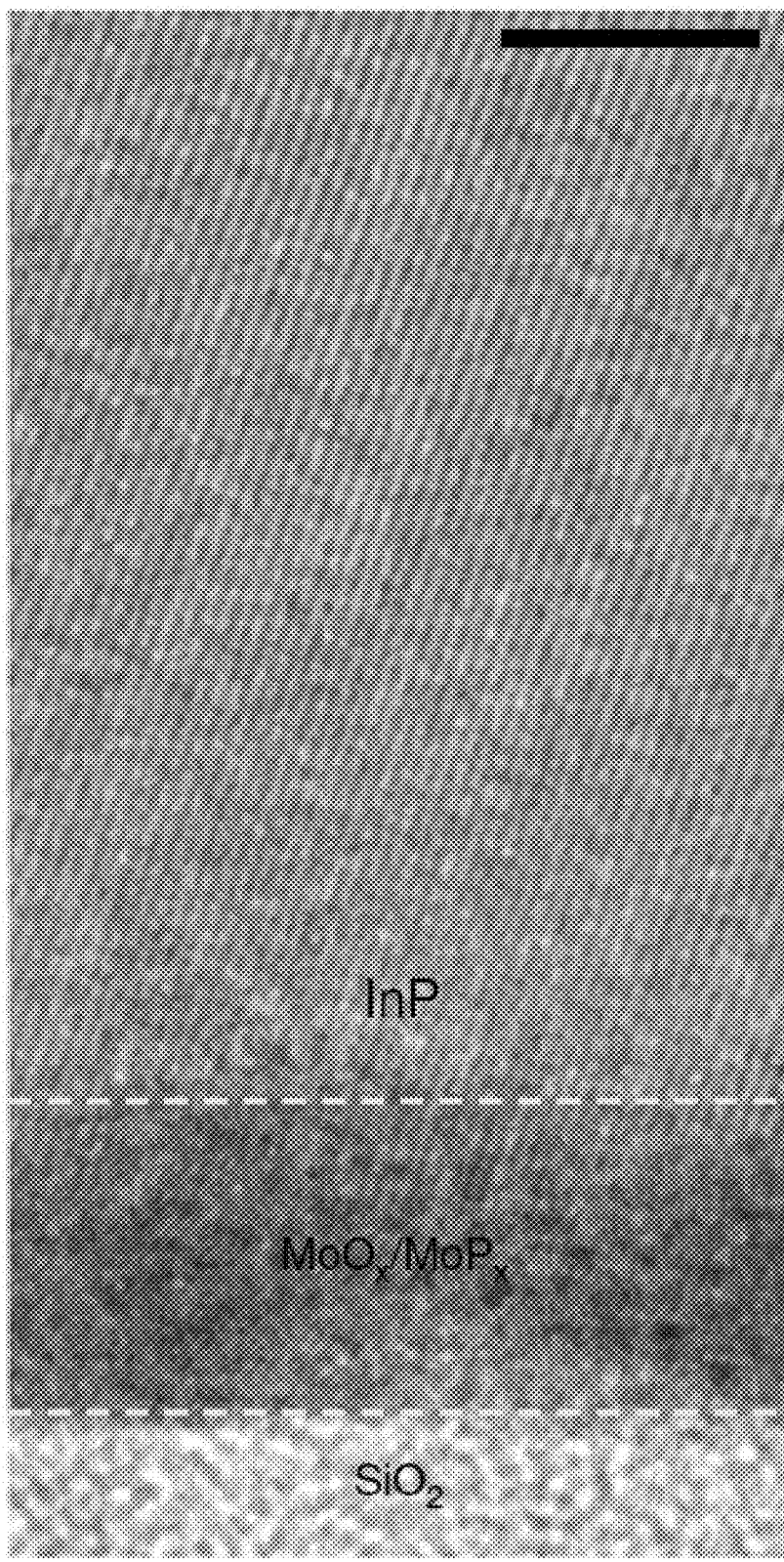
FIG. 3C shows an example of a cross-sectional transmission electron microscopy (TEM) image of an InP sample.

Transmission electron microscopy (TEM) was used to examine the crystallinity of the InP patterns. From the cross-sectional TEM image of an InP sample shown in FIG. 3C, it can be seen that a crystalline InP lattice sits on top of the amorphous $SiO_2$ substrate with a thin $MoO_x/MoP_x$ nucleation layer in between, showing the non-epitaxial nature of TLP crystal growth. The scale bar in FIG. 3C is 5 nm.

Figure 4A:
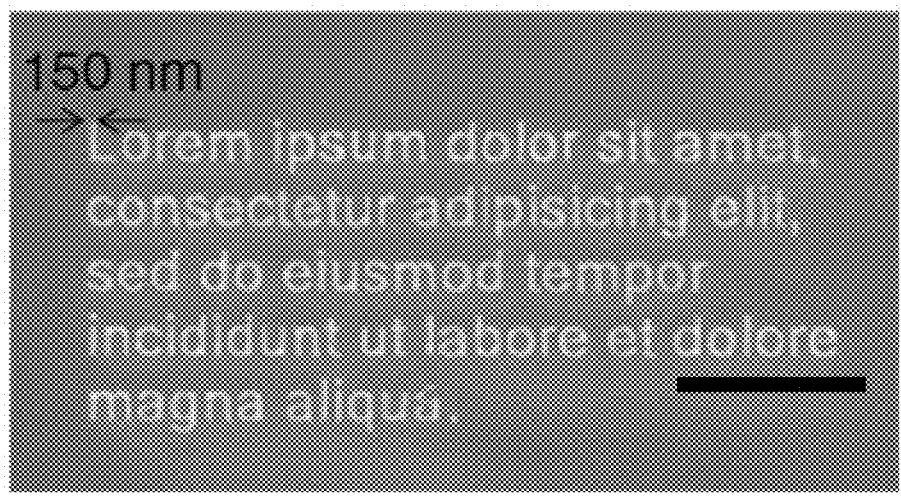
FIG. 4A-4C show examples of images of different implementations of the process for growing a single crystalline III-V semiconductor on an amorphous substrate.
Figure 4B:
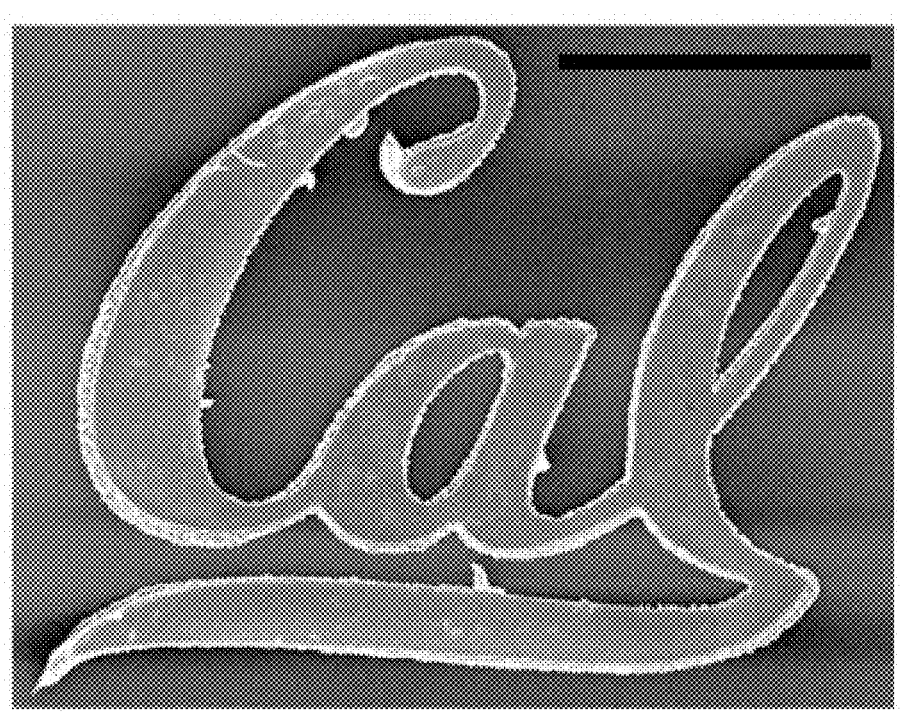

To demonstrate the versatility of the TLP crystal growth technique, a small version of the 'Lorem Ipsum' placeholder text was written in crystalline InP lettering with a stroke width of 150 nm, as shown in FIG. 4A. The scale bar in FIG. 4A is 3 microns. In addition, a single-crystalline Berkeley 'Cal' logo with dimensions of 80 microns×60 microns is shown in FIG. 4B. The scale bar in FIG. 4B is 30 microns. The structural, compositional, and optoelectronic properties were characterized via EBSD, EDS mapping, and photoluminescence imaging, respectively. While letters were used for demonstration purposes, the geometric degrees of freedom available to grow single-crystalline materials with TLP crystal growth are of great significance for the fabrication of practical electronic and photonic devices.

One major advantage of TLP crystal growth is ease of scalability. Unlike traditional III-V growth where both group III and V elements are introduced in the vapor phase, only the group V element is in the vapor phase, and the geometry is fixed by the template. This allows for simple reactor designs which can be easily scaled up. Furthermore, as growth only occurs when both group III and group V elements are present, the templates essentially provide a self-limiting growth mechanism, preventing unwanted thickness or compositional variation across a wafer. As a demonstration, arrays of InP circles outlined by InP bars were grown across a full 4-inch $Si/SiO_2$ wafer using a simple cold-wall furnace.

The relatively low temperature required for TLP crystal growth also allows for a broad range of substrates upon which single-crystalline III-V's can be grown. As an example, InP circles were directly written onto a borosilicate glass slide and their optical quality was verified via photoluminescence imaging. The borosilicate glass slide was patterned before deposition of In on the glass slide. In addition, the grown InP can be fully transferred onto plastic substrates for applications where a flexible substrate is desired. As an example, InP circle arrays were transferred onto a polyethylene terephthalate (PET) substrate using polyamic acid.

Figure 4C:
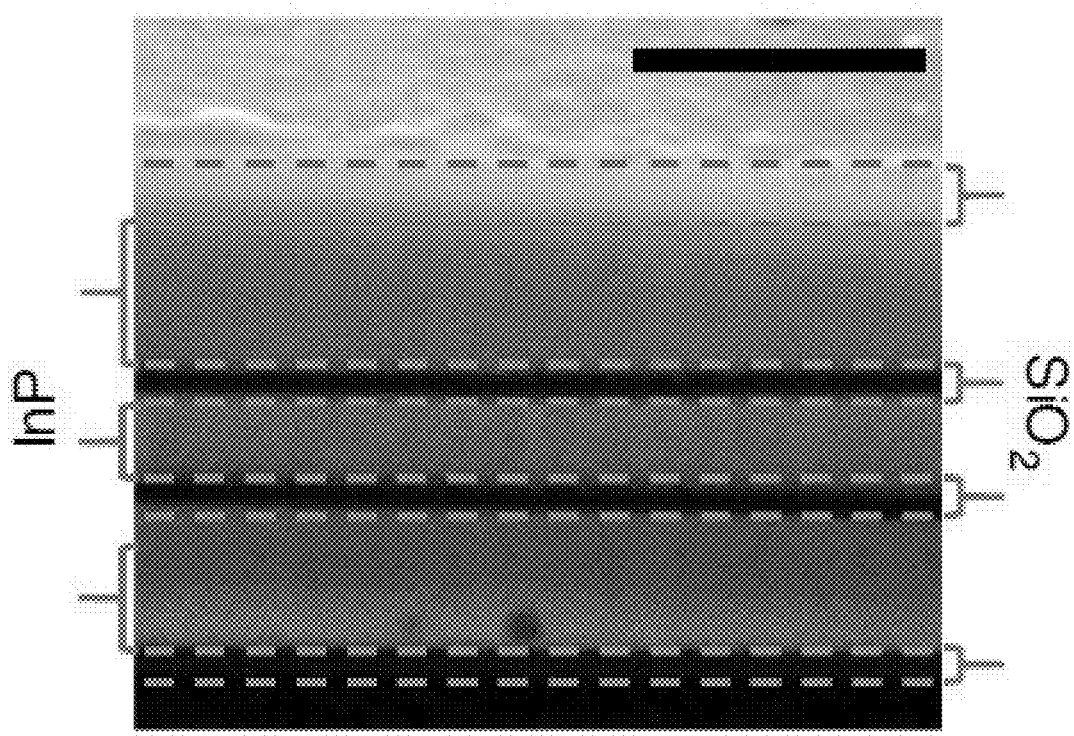

A unique feature of the TLP crystal growth process is that complex 3D architectures can be achieved, beyond the limits of traditional processes. For instance, multilayers of InP single crystals separated by amorphous $SiO_x$ layers can be grown in one cycle by starting with substrates comprising multilayer $In/SiO_x$ layers, as demonstrated in the cross-sectional SEM image shown in FIG. 4C. In FIG. 4C, three layers of InP were grown with 30 nm of SiOx between each layer. The scale bar in FIG. 4C is 500 nm.

Figure 5A:
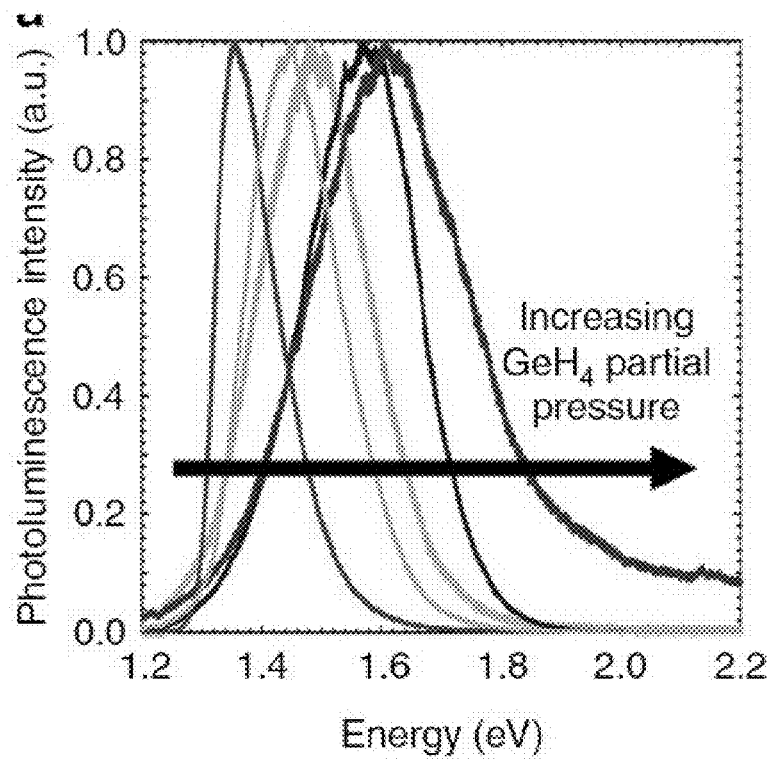
FIGS. 5A and 5B show the results of experiments of doping a single crystalline III-V semiconductor while growing it on an amorphous substrate.
Figure 5B:
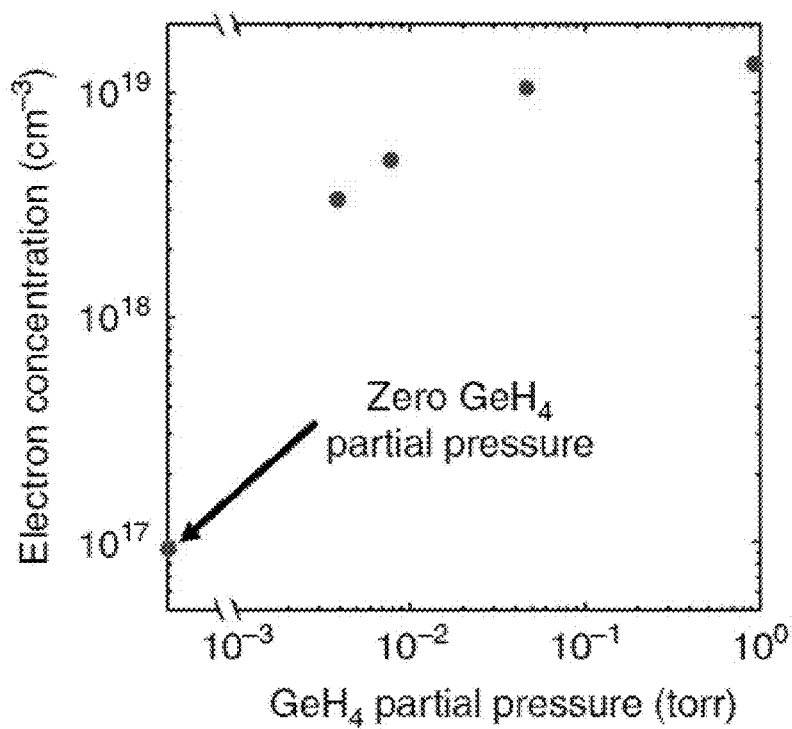

A critical component of semiconductor growth is the ability to tune the optical and electrical properties—in particular, the doping concentration. To explore this capability, $GeH_4$ gas was introduced into the growth chamber during growth to achieve controlled in situ n-type Ge doping of InP. FIG. 5A shows the normalized photoluminescence spectra of InP single crystals grown under different partial pressures of $GeH_4$ (0 mTorr, 3.9 mTorr, 7.7 mTorr, 46 mTorr, and 900 mTorr). Significant blue-shifting of the photoluminescence peak versus a lightly doped reference wafer is observed as the $GeH_4$ partial pressure is increased owing to the Burstein-Moss effect, indicating increased electron concentrations. The electron concentrations, approximated from the photoluminescence peak energies, are plotted versus the $GeH_4$ partial pressure in FIG. 5B indicating that TLP grown InP can be doped up to a degenerate level of $\sim 1.3 \times 10^{19}$ $cm^{-3}$, near the upper limit of electron doping in InP. From the photoluminescence spectra, the Urbach tail parameter was also extracted and plotted versus the carrier concentration level. The Urbach tail parameter is an important figure of merit regarding the band edge sharpness arising from crystal defects, thermal vibrations, and charged impurities. The Urbach tails of the non-epitaxial TLP grown samples were similar to the values reported in literature for InP single crystal wafers at various respective levels of doping.

The electronic quality and practical utility of TLP-growth InP in the shape of microwires were explored by fabricating long-channel Schottky n-type metal-oxide-semiconductor field effect transistors (MOSFETs) with top gates. The devices fabricated were similar to the device shown above in FIGS. 2F and 2G.

InP microwires with dimensions of 1 micron×50 microns and thicknesses of 125 nm were grown using TLP crystal growth as described above. Photolithography was used to lithographically define the source/drain contacts followed by evaporation of 3 nm/10 nm/40 nm of Ge/Au/Ni, respectively, and liftoff. The source/drain contacts were subsequently annealed at 375° C. for 5 minutes to alloy the Ge with InP in the contact regions to improve contact resistance. 10 nm of $ZrO_2$ was then deposited via atomic layer deposition at a temperature of 200° C. Finally, photolithography was used to define the gate electrode. For the MOSFETs, 40 nm of Ni was evaporated as the top gate metal while for the photo-MOSFETs, 30 nm of ITO was deposited via sputtering to allow optical access to the channel.

The transfer and output characteristics of an InP transistor on a $Si/SiO_2$ substrate with a gate length of 3 microns and body thickness of ~125 nm were measured. The device exhibited an ON-current of 120 $\mu A\ \mu m^{-1}$ at $V_{GS}=V_{DS}=2$ V with an ON/OFF current ratio of $>10^5$ and peak extrinsic transconductance of 100 S $\mu m^{-1}$, which is excellent for a long-channel device. An effective electron mobility of $\mu=675\ cm^2\ V^{-1}\ s^{-1}$ was extracted from device simulations, which compares favorably with unpassivated InP nanowire/microwire MOSFETs in the literature, illustrating the excellent electronic quality of the InP grown here.

In addition, top-gated InP photo-MOSFETs were also fabricated on $Si/SiO_2$ substrates using the device structure described above with a transparent indium tin oxide (ITO) gate electrode being used with a channel length of $L_G=20$ microns. The device electrical characteristics were measured under dark and under steady-state illumination from a bandpass filtered white light source with an optical intensity of 15.6 mW $cm^{-2}$. The device exhibited a strong photoresponse with a peak responsivity of ~700 A $W^{-1}$ at $V_{GS}=3.4$ V. Further, the specific detectivity (D*) of this device displays a maximum of $\sim 8.4 \times 10^{11}$ Jones at room temperature, comparable to state-of-the-art single-crystalline epitaxial InGaAs detectors.

In summary, a technique that enables direct 'writing' of optoelectronic-quality single-crystalline III-V semiconductors on amorphous substrates has been described above. The elimination of the requirement for lattice-matched substrates as well as the improved scalability of this growth mode enables integration of III-V semiconductors for a wide range of applications on user-defined substrates. While InP was used as a model growth system, the TLP crystal growth method is one that, from a thermodynamic and kinetic point of view, is expected to be applicable to other technologically important III-V semiconductors. As an example, proof of concept demonstrations using the TLP process to grow GaP and InSb were also performed. In addition, a single crystal grown via the TLP growth process may potentially be utilized as a virtual substrate in an epitaxial growth process, allowing for the realization of high-quality semiconductor heterostructures grown directly onto amorphous substrates.

Further details regarding the embodiments described herein can be found in the publication Chen, K. et al. "Direct growth of single-crystalline III-V semiconductors on amorphous substrates." Nature Communications 7:10502 (2016), which is herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method comprising:
   (a) defining a shape of a semiconductor structure to be formed on an amorphous substrate in a resist disposed on the amorphous substrate;
   (b) depositing a boron group element over the amorphous substrate;
   (c) depositing a ceramic material on the boron group element;
   (d) removing the resist from the amorphous substrate;
   (e) depositing the ceramic material to cover the boron group element; and
   (f) heating the amorphous substrate and materials deposited thereon in the presence of a gas including a nitrogen group element to grow a single crystal semiconductor structure comprising the boron group element and the nitrogen group element.

2. The method of claim 1, further comprising:
after operation (f), removing the ceramic material.

3. The method of claim 1, further comprising:
after operation (a), depositing a nucleation layer on the amorphous substrate, and wherein the boron group element is deposited on the nucleation layer in operation (b).

4. The method of claim 3, wherein the nucleation layer comprises an oxide material.

5. The method of claim 3, wherein the nucleation layer is about 1 nanometers to 10 nanometers thick.

6. The method of claim 3, wherein the nucleation layer comprises $MoO_x$.

7. The method of claim 1, wherein the boron group element is selected from a group consisting of boron, aluminum, gallium, and indium.

8. The method of claim 1, wherein the boron group element deposited over the amorphous substrate has a thickness of about 10 nanometers to 5 microns thick.

9. The method of claim 1, wherein the nitrogen group element is selected from a group consisting of nitrogen, phosphorus, arsenic, and antimony.

10. The method of claim 1, wherein the amorphous substrate comprises a material selected from a group consisting of silicon dioxide, aluminum oxide, and an oxide glass.

11. The method of claim 1, wherein the amorphous substrate and the materials deposited thereon are heated to about 300° C. to 1500° C.

12. The method of claim 1, wherein the amorphous substrate and the materials deposited thereon are maintained at a temperature of about 300° C. to 1500° C. for about 5 minutes to 2 hours.

13. The method of claim 1, wherein a length or a width of the single crystal semiconductor structure is about 10 nanometers to 500 microns.

14. The method of claim 1, wherein a thickness of the ceramic material after operation (e) is about 10 nanometers to 200 nanometers.

15. The method of claim 1, wherein operation (f) further includes heating the amorphous substrate and materials deposited thereon in the presence of a gas including a doping element.

16. The method of claim 1, wherein the single crystal semiconductor structure comprises a semiconductor selected from a group consisting of boron nitride, boron phosphide, boron arsenide, aluminum nitride, aluminum phosphide, aluminum arsenide, aluminum antimonide, gallium nitride, gallium phosphide, gallium arsenide, gallium antimonide, indium nitride, indium phosphide, indium arsenide, and indium antimonide.

17. The method of claim 1, where in the resist comprises a photoresist or an electron resist.

18. The method of claim 1, wherein the ceramic material comprises a material selected from a group consisting of silicon oxide ($SiO_x$), silicon nitride ($SiN_x$), and aluminum oxide ($AlO_x$).

19. The method of claim 1, wherein after operation (e) the boron group element is in contact only with the ceramic material and the amorphous substrate.

20. A method comprising:
(a) defining a shape of a semiconductor structure to be formed in a resist deposited on an layer of $SiO_2$;
(b) depositing a layer of $MoO_x$ on the layer of $SiO_2$;
(c) depositing indium (In) on the layer of $MoO_x$;
(d) depositing $SiO_x$ on the In;
(e) removing the resist from the layer of $SiO_2$;
(f) depositing $SiO_x$ to cover the In; and
(g) heating the layer of $SiO_2$ and materials deposited thereon in the presence of $PH_3$ to grow a single crystal semiconductor structure comprising InP.

* * * * *